US011784029B2

(12) United States Patent
Jin et al.

(10) Patent No.: US 11,784,029 B2
(45) Date of Patent: Oct. 10, 2023

(54) METHOD AND APPARATUS FOR ATOMIC LAYER ETCHING

(71) Applicant: WONIK IPS CO., LTD., Pyeongtaek-si (KR)

(72) Inventors: Kwang Seon Jin, Osan-si (KR); Sang Jun Park, Yongin-si (KR); Byung Chul Cho, Hwaseong-si (KR); Jun Hyuck Kwon, Osan-si (KR); Jong Ki An, Daejeon (KR); Tian Hao Han, Suwon-si (KR)

(73) Assignee: WONIK IPS CO., LTD., Pyeongtaek-si (KR)

( * ) Notice: Subject to any disclaimer, the term of this patent is extended or adjusted under 35 U.S.C. 154(b) by 0 days.

(21) Appl. No.: 17/367,100

(22) Filed: Jul. 2, 2021

(65) Prior Publication Data

US 2022/0059325 A1 Feb. 24, 2022

(30) Foreign Application Priority Data

Aug. 18, 2020 (KR) ........................ 10-2020-0103249

(51) Int. Cl.
*H01J 37/32* (2006.01)
*H01L 21/311* (2006.01)
*H01L 21/3213* (2006.01)

(52) U.S. Cl.
CPC .... *H01J 37/32522* (2013.01); *H01J 37/3244* (2013.01); *H01L 21/31122* (2013.01); *H01L 21/32136* (2013.01); *H01J 2237/2001* (2013.01); *H01J 2237/334* (2013.01)

(58) Field of Classification Search
None
See application file for complete search history.

(56) References Cited

U.S. PATENT DOCUMENTS

2018/0182634 A1* 6/2018 Smith ............... H01J 37/32899
2021/0104414 A1* 4/2021 Panagopoulos ... H01L 21/32138

FOREIGN PATENT DOCUMENTS

| TW | 201719712 A | 6/2017 |
| TW | 201721751 A | 6/2017 |
| TW | 201738952 A | 11/2017 |
| TW | 201907241 A | 2/2019 |
| TW | 201923893 A | 6/2019 |

\* cited by examiner

*Primary Examiner* — Stephanie P Duclair
(74) *Attorney, Agent, or Firm* — William Park & Associates Ltd.

(57) ABSTRACT

A method for atomic layer etching may include a step of providing a substrate on which a material to be etched is formed, a modifying step of controlling the substrate at a first temperature and modifying a surface layer of the material to be removed by supplying a modifying gas to the substrate, and an etching step of controlling the substrate at a second temperature different from the first temperature and removing the modified surface layer by supplying an etching gas to the substrate.

16 Claims, 4 Drawing Sheets

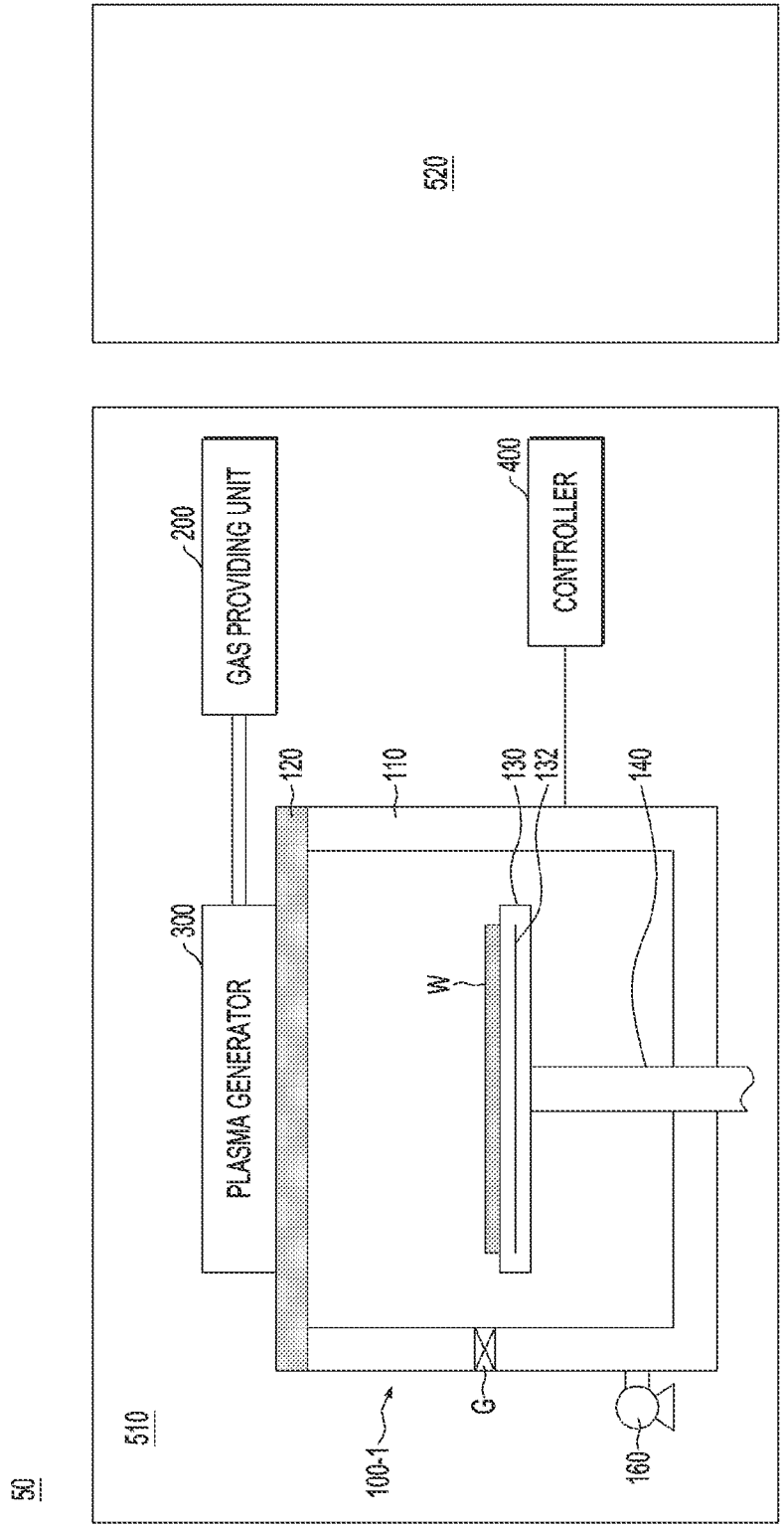

METHOD AND APPARATUS FOR ATOMIC LAYER ETCHING

CROSS-REFERENCES TO RELATED APPLICATION

The present application claims priority under 35 U.S.C, § 119(a) to Korean application number 10-2020-0103249, filed on Aug. 18, 2020, in the Korean Intellectual Property Office, which is incorporated herein by reference in its entirety.

BACKGROUND

1. Technical Field

Various embodiments generally relate to a method of manufacturing a semiconductor apparatus, and more particularly, to a method and an apparatus for atomic layer etching.

2. Related Art

In a process of manufacturing a semiconductor apparatus, an etching process is a process of selectively removing a target material in order to form a desired structure.

Atomic layer etching (ALE) has been studied to remove a target material by a target amount (thickness).

The ALE process may be referred to as an etching process in which a step of modifying the surface of the target material and a step of removing the modified surface are repeated in a set cycle.

Since the ALE process enables the target material to be removed at an atomic level, it is being actively applied to a process of manufacturing increasingly miniaturized semiconductor apparatuses.

In the current ALE process, a modifying step and a removing step are performed while maintaining a state in which a substrate has been heated at a high temperature.

Therefore, a thermal shock may be applied to a target material, resulting in changes in a crystal structure and electrical properties thereof.

SUMMARY

In an embodiment, a method for atomic layer etching may include: a step of providing a substrate on which a material to be etched is formed; a modifying step of controlling the substrate at a first temperature and modifying a surface layer of the material to be removed by supplying a modifying gas to the substrate; and an etching step of controlling the substrate at a second temperature different from the first temperature and removing the modified surface layer by supplying an etching gas to the substrate.

In an embodiment, an apparatus for atomic layer etching may include: a chamber where a first processing space and a second processing space are formed; a gas supply device configured to inject a process gas into the chamber; a plasma generator activated in a plasma atmosphere and configured to radicalize the process gas provided from a gas providing unit, and to supply the radicalized process gas into the chamber through the gas supply device; a susceptor installed to face the gas supply device and having at least one substrate mounted thereon; first temperature control means configured to surround an upper part of an inner wall of the chamber and to form the first processing space; second temperature control means configured to surround a lower part of the inner wall of the chamber and to form the second processing space; and a controller configured to control a substrate, which is loaded in the first processing space, at the first temperature by controlling the first temperature control means, and to control a substrate, which is loaded in the second processing space, at the second temperature by controlling the second temperature control means, wherein a surface layer of a material to be etched is modified in any one of the first processing space and the second processing space, and the modified surface layer is etched in the other processing space.

BRIEF DESCRIPTION OF THE DRAWINGS

FIG. 5 is a configuration diagram of an apparatus for atomic layer etching in accordance with an embodiment.

DETAILED DESCRIPTION

Hereinafter, an embodiment of the present technology will be described in more detail with reference to the accompanying drawings.

Figure 1:
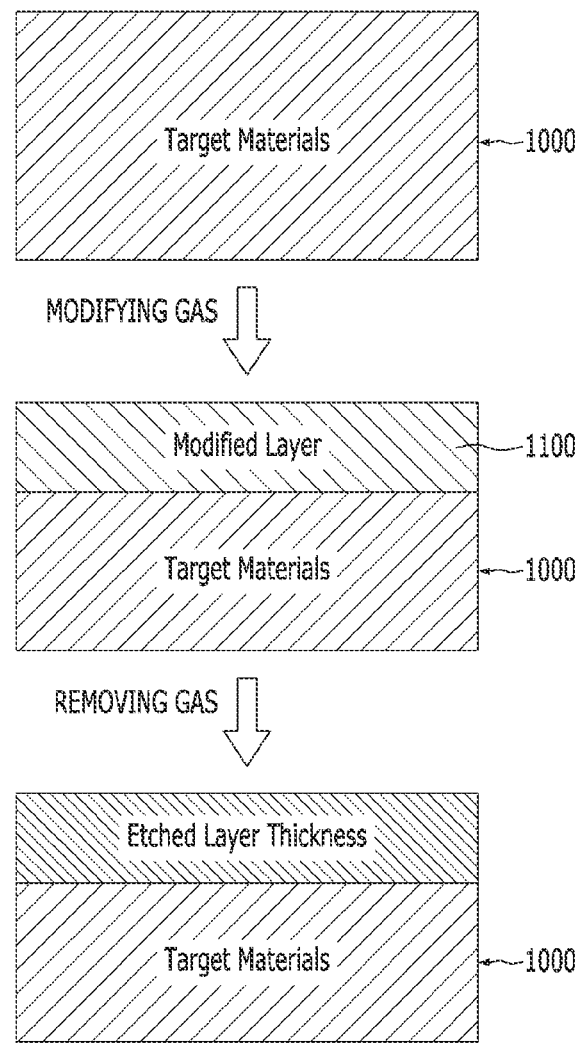
FIG. 1 is a conceptual diagram for explaining a method for atomic layer etching in accordance with an embodiment.

FIG. 1 is a conceptual diagram for explaining a method for atomic layer etching in accordance with an embodiment.

Referring to FIG. 1, a substrate, on which target materials 1000 to be subjected to an ALE process are formed, may be provided to an apparatus for atomic layer etching.

Then, a modifying gas may be provided into the apparatus for atomic layer etching to modify a surface layer 1100 of the target materials 1000. The modifying gas may be determined according to the type of the target materials 1000.

After the surface layer 1100 is modified, an etching gas may be supplied. Accordingly, the modified surface layer 1100 of the target materials 1000 may be removed.

Figure 2:
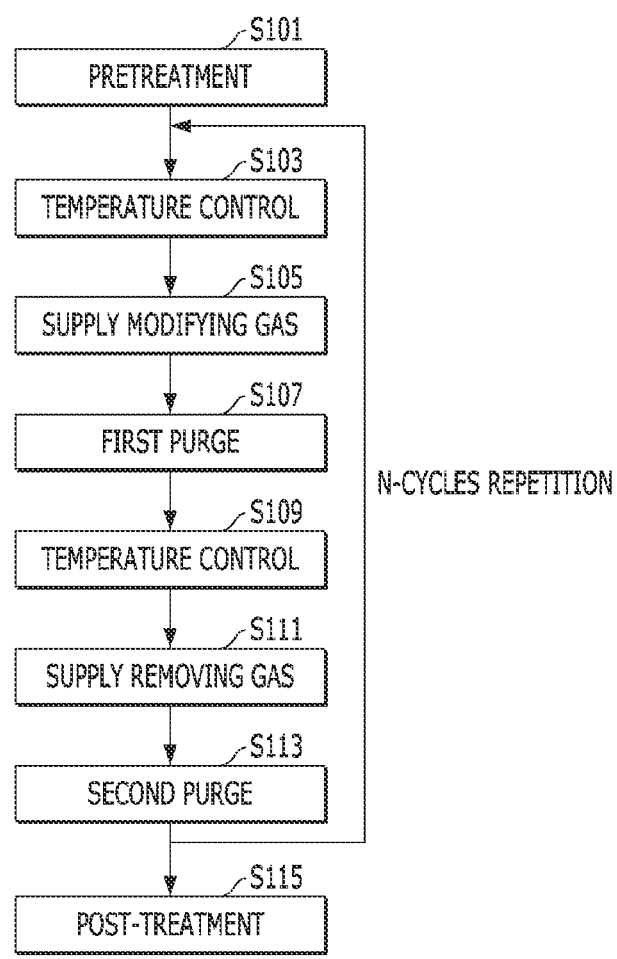
FIG. 2 is a flowchart for explaining a method for atomic layer etching in accordance with an embodiment.
Figure 3:
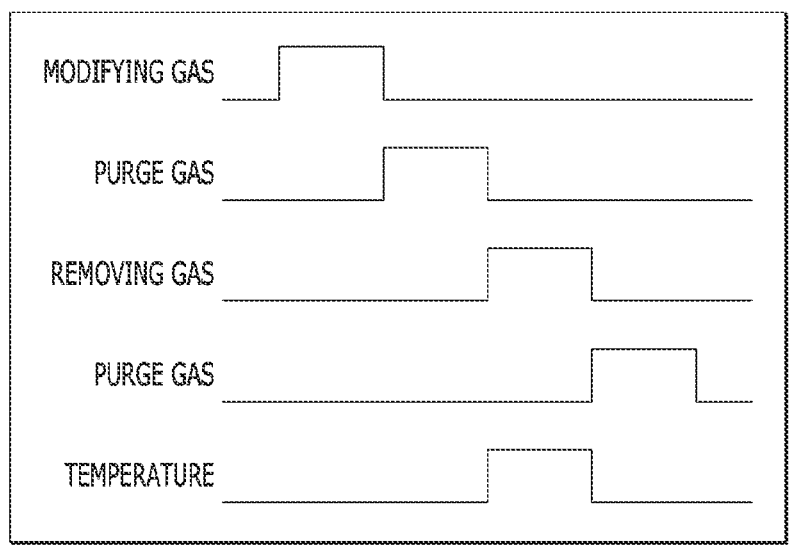
FIG. 3 is a graph for explaining one cycle of an ALE process in accordance with an embodiment.

FIG. 2 is a flowchart for explaining a method for atomic layer etching in accordance with an embodiment, and FIG. 3 is a graph for explaining one cycle of an ALE process in accordance with an embodiment.

Referring to FIG. 2, after a target substrate, on which a target material is formed, is loaded into a chamber, a pretreatment process may be performed (S101). The pretreatment process may be a process of radicalizing a gas selected among hydrogen and an inert gas and injecting the radicalized gas into the chamber. In an embodiment, the target material may be selected from the metal oxide film group consisting of $Al_2O_3$, $HfO_2$, and $ZrO_2$, but the present disclosure is not limited thereto.

Then, as illustrated in FIG. 2 and FIG. 3, the substrate may be controlled at a first temperature (S103). The first temperature may be set to a temperature enabling the supply of minimum energy capable of modifying a surface layer of the target material.

When the substrate is controlled at the first temperature, a modifying gas is supplied to modify the surface layer (S105). The modifying gas may be radicalized and supplied by a plasma generator. The plasma generator may be selected from a direct plasma generator, a remote plasma generator, and a microwave plasma generator. In addition, the remote plasma generator may use a capacitor coupled plasma (CCP) method, an inductively coupled plasma (ICP) method, or the like.

In an embodiment, the modifying gas may be selected from the group consisting of $NF_3$, $F_2$, $CHF_3$, $OF_2$, and the like.

As the modifying gas is supplied, the surface layer of the target material is changed to have properties that can be removed in a subsequent removing step.

In an embodiment, when the target material is $Al_2O_3$ and one of $NF_3$, $F_2$, $CHF_3$, and $OF_2$ is used as the modifying gas, the property of the $Al_2O_3$ surface layer after modifying is changed from $Al_2O_3$ to AlF.

After the surface layer is modified, first purge may be performed using an inert gas such as argon gas (Ar) (S107). Through the first purge, the modifying gas remaining on the substrate surface is removed. In an embodiment, the purge gas may be continuously supplied from the modifying gas supply step S105, but the present disclosure is not limited thereto.

Then, the substrate may be controlled at a second temperature (S109). The second temperature may be set to a temperature at which a ligand exchange reaction may occur between an etching gas subsequently supplied and the modified surface layer.

In an embodiment, the second temperature may be higher by 50° C. to 100° C. than the first temperature.

When the temperature of the substrate increases to the second temperature, the etching gas is supplied (S111). The etching gas may be supplied by vaporizing a metal-containing precursor, and may be determined according to the type of the target material.

In an embodiment, when the target material is $Al_2O_3$, and $ZrO_2$, the metal-containing precursor may be selected from metal organic precursors such as trimethyl aluminum (TMA), dimethyl aluminum chloride (DMA), and acetylacetonate (ACAC).

Then, reaction by-products and residual gas may be removed through a second purge step S113 using an inert gas such as argon gas (Ar). In an embodiment, the purge gas may be continuously supplied even when the etching gas is supplied.

From the temperature control step S103 of controlling the substrate at the first temperature to the second purge step S113 constitutes one cycle of the ALE process according to the present technology, and the total number of cycles (N=L/M) may be determined according to a total thickness L of the target material to be removed and a thickness M of the target material to be removed by the one cycle.

After the surface layer is removed, a modified material remaining on the substrate surface may be removed through a post-treatment process (S115), In an embodiment, the post-treatment process may be a process of radicalizing a gas selected from hydrogen and an inert gas and injecting the radicalized gas into the chamber.

A $ZrO_2$ film having a high dielectric constant is applied as a dielectric film of a semiconductor apparatus, and has a temperature-sensitive characteristic.

In the ALE process in the related art, the modifying and removing steps are performed at the same high temperature.

Accordingly, when the radicalized modifying gas is injected into the $ZrO_2$ film at a temperature of 200° C. or higher, the crystal structure thereof is changed due to thermal stress caused by a surface reaction. Therefore, a lifting phenomenon such as hillock occurs on the film surface, resulting in changes in the electrical properties thereof.

In order to substantially prevent such a problem, when the ALE process is performed at a low temperature of about 100° C., a ligand exchange reaction through a chemical reaction of the etching gas does not occur, which makes etching impossible.

According to the present technology, modifying may be performed at a low temperature in order to supply minimum energy capable of modifying a film surface, and a ligand exchange reaction may be caused by increasing the temperature before an etching gas is injected, which makes it possible to remove a target film by a target thickness.

In another embodiment of the present technology, the target material layer may be selected from the metal film group consisting of TiN and Ta.

In order to remove such a metal film by the atomic layer etching method, the temperature of the substrate may be controlled at a first temperature (S103) as illustrated in FIG. 2 and FIG. 3. The first temperature may be set to a temperature enabling the supply of minimum energy capable of modifying the surface layer of the target material.

When the substrate is controlled at the first temperature, a modifying gas is supplied to modify the surface layer (S105). The modifying gas may be supplied by vaporizing hydrogen peroxide through corona discharge by using a gas containing oxygen, for example, $O_3$ or $H_2O$ as a carrier gas.

As the modifying gas is supplied, the surface layer of the target material is changed to have properties that can be removed in a subsequent removing step.

When the target material is TiN and one of $OF_2$ and $H_2O_2$ is used as the modifying gas, the surface layer of the TiN after modifying is changed to $TiO_2$ according to the following chemical formula.

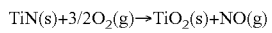
$$TiN(s)+3/2O_2(g)\rightarrow TiO_2(s)+NO(g)$$

$$TiN(s)+3H_2O_2(g)\rightarrow TiO_2(s)+NO(g)+3H_2O(g)$$

After the surface layer is modified, first purge may be performed using an inert gas such as argon gas (Ar) (S107). Through the first purge, the modifying gas remaining on the substrate surface is removed. In an embodiment, the purge gas may be continuously supplied from the modifying gas supply step S105, but the present disclosure is not limited thereto.

Then, the temperature of the substrate may be controlled at a second temperature (S109). The second temperature may be set to a temperature at which an etching gas subsequently supplied and the modified surface layer may react.

In an embodiment, the second temperature nay be lower by 50° C. to 100° C. than the first temperature.

When the temperature of the substrate decreases to the second temperature, the etching gas is supplied (S111). The etching gas may be radicalized and supplied by a plasma generator. The plasma generator may be selected from a direct plasma generator, a remote plasma generator, and a microwave plasma generator. In addition, the remote plasma generator may use a capacitor coupled plasma (CCP) method, an inductively coupled plasma (ICP) method, or the like.

In an embodiment, the modified surface layer $TiO_2$ of the TiN film, which is a target material layer, may be removed using one of $NF_3$, $F_2$, $CHF_3$, $OF_2$, and $CF_4$ as the etching gas.

The properties of the TiN film and the $TiO_2$ film reacting with a fluorine-containing gas are as follows.

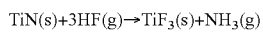
$$TiN(s)+3HF(g)\rightarrow TiF_3(s)+NH_3(g)$$

$$TiO_2(s) + 4HF(g) \rightarrow TiF_4(s) + 2H_2O(g)$$

The $TiF_3$ produced by fluorination of the TiN film is a solid and remains on the surface without being removed due to its nonvolatile properties. On the other hand, since the $TiF_4$ produced as a result of fluorination of the $TiO_2$ film is a gas, it has volatility and an ALE reaction is possible.

Accordingly, modifying may be performed at the first temperature in order to supply minimum energy capable of modifying a film surface of a target material, and a ligand exchange reaction may be caused by changing the temperature to the second temperature before an etching gas is injected, thereby removing a target film by a target thickness.

Then, reaction by-products and residual gas may be removed through a second purge step S113 using an inert gas such as argon gas (Ar). In an embodiment, the purge gas may be continuously supplied even when the etching gas is supplied.

After the surface layer is removed, a modified material remaining on the substrate surface may be removed through a post-treatment process (S115). In an embodiment, the post-treatment process may be a process of radicalizing a gas selected from hydrogen and an inert gas and injecting the radicalized gas into the chamber.

As described above, the ALE process of the TiN film is performed by oxidizing the surface using an oxygen-containing gas ($O_3$ or $H_2O_2$) as a modifying gas, converting the surface into $TiO_2$, and injecting a radicalized etching gas in a repetitive manner. At this time, in order to oxidize the surface of the TiN film, a temperature of 200° C. or more is required, and in the case of the radicalized etching gas, a temperature of 150° C. or less is required to selectively remove the $TiO_2$ film.

Accordingly, it is possible to perform the atomic layer etching process at a desired thickness while maintaining the properties of a target film to be removed by controlling the temperatures in the modifying step and the removing step.

Figure 4:
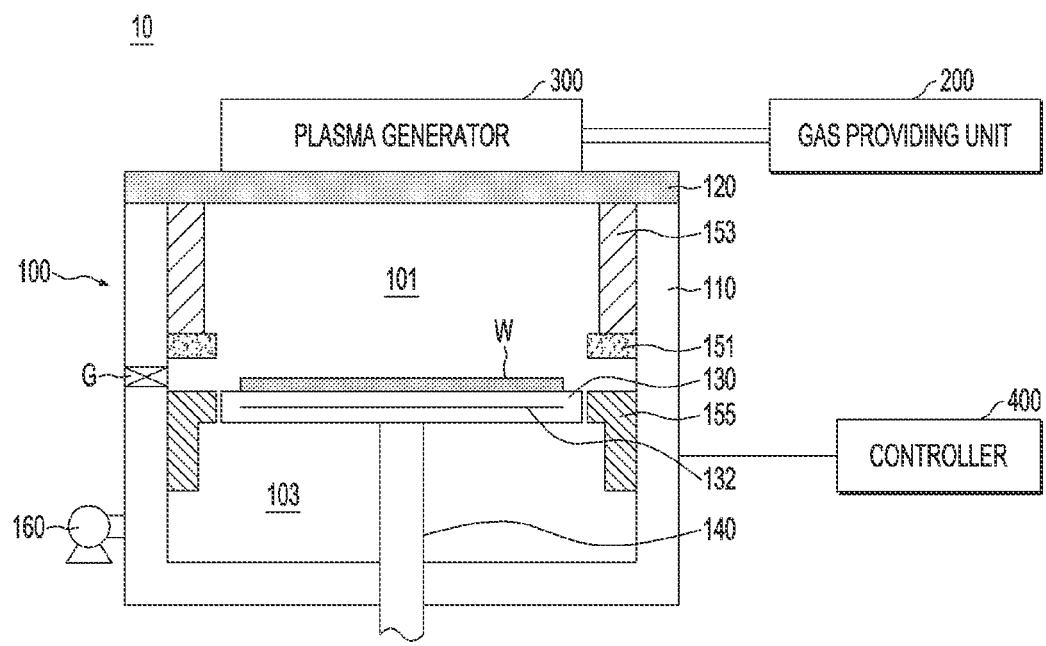
FIG. 4 is a configuration diagram of an apparatus for atomic layer etching in accordance with an embodiment.

FIG. 4 is a configuration diagram of an apparatus 10 for atomic layer etching in accordance with an embodiment.

Referring to FIG. 4, the apparatus 10 for atomic layer etching may include a chamber 100, a gas providing unit 200, a plasma generator 300, and a controller 400.

The chamber 100 may include a body 110 with an open top and a top lid 120 installed on an outer periphery of the top of the body 110. An inner space of the top lid 120 may be closed by a gas supply device 121 such as a shower head. An insulating ring R may be installed between the gas supply device 121 and the top lid 120 to electrically insulate the chamber 100 from the gas supply device 121.

Inner spaces 101 and 103 of the chamber 100 may be spaces where processing for a substrate W such as an etching or a deposition process is performed. A gate G, through which the substrate W is carried in and out, may be provided at a designated position on the side of the body 110. A support shaft 140 of a susceptor 130, on which the substrate W is mounted, may be inserted into the chamber 100 through the bottom surface of the body 110.

The susceptor 130 may have a flat plate shape as a whole so that at least one substrate w is mounted on the upper surface of the susceptor 130, and may be installed in a horizontal direction while facing a gas supply device 121. The support shaft 140 may be vertically coupled to the rear surface of the susceptor 130, may be connected to a driving unit (not illustrated) outside the chamber 100, and may be configured to move the susceptor 130 upward or downward and/or rotate the susceptor 130.

A heater 132 may be provided inside the susceptor 130 to adjust the temperature of the substrate W mounted thereon.

Since a vacuum atmosphere is generally created in the chamber 100, an exhaust port connected to a pump 160 may be formed at a designated position of the body 110, for example, on one side of a lower portion of the body 110.

The gas supply device 121 may be installed at an upper portion of the body 110 to face the susceptor 130. The gas supply device 121 may inject various process gases, which are supplied from the gas providing unit 200, into the chamber 100. The gas supply device 121 may be selected from various types of gas supply devices such as a shower head type, an injector type, and a nozzle type.

The gas providing unit 200 may be configured to provide a modifying gas, an etching gas, a purge gas, and the like to the gas supply device 121 through the plasma generator 300.

The plasma generator 300 may be activated in a plasma atmosphere when plasma power is applied thereto, and may radicalize the process gases supplied from the gas providing unit 200.

The plasma generator 300 may be selected from a direct plasma generator, a remote plasma generator, and a microwave plasma generator. In addition, the remote plasma generator may use a capacitor coupled plasma (CCP) method, an inductively coupled plasma (ICP) method, or the like.

The controller 400 is configured to control the overall operation of the apparatus 10 for atomic layer etching. In an embodiment, the controller 400 may control the operations of the chamber 100, the gas providing unit 200, and the plasma generator 300, and set a control parameter and the like for a thin film etching process through an interface with an operator. Although not illustrated, the controller 400 may include a central processing unit, a memory, an input/output interface, and the like.

The apparatus 10 for atomic layer etching in accordance with an embodiment of the present technology may further include first temperature control means 153 for controlling a first processing space 101 at a first temperature and second temperature control means 155 for controlling a second processing space 103 at a second temperature.

The first temperature control means 153 may be configured to surround the upper part of an inner wall of the chamber 100 to form the first processing space 101. The second temperature control means 155 may be configured to surround the lower part of the inner wall of the chamber 100 to form the second processing space 103.

The first temperature control means 153 and the second temperature control means 155 may be insulated from each other by an insulating member 151.

In an embodiment, during the modifying process, the susceptor 130 may be moved upward toward the first processing space 101 by the support shaft 140, and the temperature of the substrate W may be controlled at a first temperature by controlling the first temperature control means 153 by the controller 400. During the removing process, the susceptor 130 may be moved downward toward the second processing space 103 by the support shaft 140, and the temperature of the substrate W may be controlled at a second temperature by controlling the second temperature control means 155 by the controller 400.

However, the present disclosure is not limited thereto, and it is of course that the substrate W may be controlled at a second temperature in the first processing space 101 and may be controlled at a first temperature in the second processing space 103.

While the ALE process is repeated for N-cycles, the temperature of the substrate W for the modifying step and the removing step may be changed by the first and second temperature control means 153 and 155 while the substrate W is moved upward and downward.

FIG. 5 is a configuration diagram of an apparatus 50 for atomic layer etching in accordance with an embodiment.

Referring to FIG. 5, the apparatus 50 for atomic layer etching may include a first processing device 510 and a second processing device 520.

Since the first processing device 510 and the second processing device 520 may have substantially the same configuration, FIG. 5 illustrates only the first processing device 510 in detail.

Each of the first and second processing devices 510 and 520 may include a chamber 100-1, the gas providing unit 200, the plasma generator 300, and the controller 400.

The chamber 100-1 may have a structure in which the first temperature control means 153, the second temperature control means 155, and the insulating member 151 are omitted from the chamber 100 illustrated in FIG. 4.

In an embodiment, the substrate W loaded onto the first processing device 510 may be controlled at a first temperature or a second temperature by the heater 132, and the substrate W loaded onto the second processing device 520 may be controlled at a second temperature or a first temperature by the heater 132.

In the modifying step of the ALE process, the substrate W may be loaded onto, for example, any one of the first processing device 510 and the second processing device 520 and may be controlled at a first temperature. In a subsequent removing step, the substrate W may be loaded onto a device different from the device in the modifying step and may be controlled at a second temperature.

The apparatus for atomic layer etching in accordance with an embodiment of the present technology may use a susceptor formed with a substrate support mounting groove in which a plurality of, for example, four or more substrate supports are arranged.

The plurality of substrate supports may be vacuum chucks or electrostatic chucks for absorbing and fixing a supported substrate, and may include a plurality of lift pins that lift a substrate supported on a substrate support surface upward from the substrate support surface and separates the substrate from the substrate support surface during substrate transfer.

A substrate transfer part may have various configurations such as a configuration of rotationally transferring a substrate from one of the plurality of substrate supports to another substrate support.

The substrate transfer part may be formed in a number corresponding to the plurality of substrate supports, and may include a plurality of substrate mounting blades, a blade coupling body and a rotation support shaft.

Each of the substrate mounting blades may have an upper surface with a mounting area where a substrate is mounted. The blade coupling body is configured to radially couple with the plurality of substrate mounting blades. The rotation support shaft is coupled to the blade coupling body to support the blade coupling body and rotatably installed around a rotating shaft perpendicular to the ground.

The plurality of substrate supports may be arranged at equal intervals along the peripheral surface of the blade coupling body around the blade coupling body of the substrate transfer part.

The plurality of substrate mounting blades may each include a mounting area for supporting a substrate, lifted upward by the lift pins of the substrate supports, by entering between the substrate and the substrate supports.

In such a case, the plurality of substrate mounting blades may be formed in a shape capable of avoiding interference with the plurality of lift pins when entering a space between the substrate supported by the lift pins and the substrate supports.

The blade coupling body may be rotated around the rotating shaft perpendicular to the ground by the rotation support shaft, thereby rotationally moving the plurality of substrate mounting blades from one substrate support to another substrate support.

Each of the plurality of substrate supports may have a heater therein.

During the ALE process, a substrate may be mounted on each substrate support, so that the ALE process may be performed at the same time. Particularly, the modifying step and the removing step may be performed in different substrate supports. A substrate support for which the modifying step is performed may be controlled at a first temperature by the heater, and a substrate support for which the removing step is performed may be controlled at a second temperature by the heater.

A substrate for which the modifying step has been completely performed in one substrate support may be moved to another substrate support by the substrate transfer part and the removing step for the substrate may be performed.

The ALE process may be performed by changing substrate temperatures in the modifying step and the removing step by using the apparatus for atomic layer etching illustrated in FIG. 4 or FIG. 5 or the aforementioned susceptor. Consequently, a surface layer can be modified without changing the crystal structure or electrical properties of a target material, and a ligand exchange reaction may occur between a modified surface layer and an etching gas, which makes it possible to remove the modified surface layer.

A person skilled in the art to which the present disclosure pertains can understand that the present disclosure may be carried out in other specific forms without changing its technical spirit or essential features, Therefore, it should be understood that the embodiments described above are illustrative in all respects, not limitative. The scope of the present disclosure is defined by the claims to be described below rather than the detailed description, and it should be construed that the meaning and scope of the claims and all changes or modified forms derived from the equivalent concept thereof are included in the scope of the present disclosure.

What is claimed is:

1. A method for atomic layer etching in a chamber where a first processing space and a second processing space are formed and including a susceptor configured to move between the first processing space and the second processing space, the method comprising:

providing a substrate on which a material to be etched is formed on the susceptor;

modifying a surface of the material under a first temperature by vertically moving on the susceptor into the first processing space controlled to maintain the substrate at the first temperature and then supplying a modifying gas in the first process space; and etching the material including a modified surface under a second temperature different from the first temperature by vertically moving the susceptor into the second process space controlled to maintain the substrate at the second temperature and supplying an etching gas to the substrate on the susceptor.

2. The method for atomic layer etching according to claim 1, further comprising:
  radicalizing the modifying gas by forming an inside of the chamber into a plasma atmosphere.

3. The method for atomic layer etching according to claim 1, wherein the first temperature is a temperature at which a minimum energy to modify the surface of the material is generated.

4. The method for atomic layer etching according to claim 1, further comprising:
  radicalizing the etching gas by forming an inside of the chamber into a plasma atmosphere.

5. The method for atomic layer etching according to claim 4,
  wherein the second temperature is a temperature at which a ligand exchange reaction occurs between the etching gas and the modified surface of the material.

6. The method for atomic layer etching according to claim 1,
  wherein the material to be etched is a metal oxide film and the second temperature is set to a temperature higher than the first temperature.

7. The method for atomic layer etching according to claim 1,
  wherein the material to be etched is a metal film and the first temperature is set to a temperature higher than the second temperature.

8. The method for atomic layer etching according to claim 7,
  wherein the second temperature is higher than by 50° C. to 100° C. than the first temperature.

9. The method for atomic layer etching according to claim 1,
  wherein the modifying step and the etching step are repeated a plurality of times.

10. The method for atomic layer etching according to claim 1,
  wherein the modifying step and the etching step are performed within the same chamber.

11. A method for atomic layer etching in a chamber including an upper inner space, a lower inner space located under the lower inner space, and a susceptor which moves up and down between the upper inner space and the lower inner space, the method comprising:
  loading a substrate including a target layer formed on an upper surface on the susceptor;
  adjusting one space selected from the upper inner space and the lower inner space to a first temperature;
  moving the susceptor to the selected space;
  supplying a first gas to an upper surface of the target layer in the selected space, to form a modified region in the upper surface of the target layer;
  adjusting another space selected from the upper inner space and the lower inner space to a second temperature different from the first temperature;
  moving the susceptor to the another space; and
  supplying a second gas to the substrate on the susceptor to etch the modified region of the target layer.

12. The method for atomic layer etching according to claim 11, wherein the second temperature is higher than the first temperature.

13. The method for atomic layer etching according to claim 12, wherein the space adjusted to the first temperature is the lower inner space and the space adjusted to the second temperature is the upper inner space.

14. The method for atomic layer etching according to claim 12, wherein the space adjusted to the first temperature is the upper inner space and the space adjusted to the second temperature is the lower inner space.

15. The method for atomic layer etching according to claim 11, wherein the modified region of the target layer is formed at the lower inner space and the modified region of the target layer is removed at the upper inner space.

16. The method for atomic layer etching according to claim 11, wherein the upper inner space and the lower inner space are linked without breaking a vacuum.

* * * * *